United States Patent
Makikawa et al.

(10) Patent No.: US 8,625,197 B2
(45) Date of Patent: Jan. 7, 2014

(54) OPTICAL ISOLATOR

(75) Inventors: Shinji Makikawa, Annaka (JP);
Toshiaki Watanabe, Annaka (JP);
Tomohiro Koyama, Chitose (JP);
Hisaya Oda, Chitose (JP); Takuya Takahashi, Sapporo (JP); Akio Yamanaka, Sapporo (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 13/008,613

(22) Filed: Jan. 18, 2011

(65) Prior Publication Data

US 2011/0181950 A1 Jul. 28, 2011

(30) Foreign Application Priority Data

Jan. 25, 2010 (JP) .................................. 2010-012708

(51) Int. Cl.
*G02B 5/30* (2006.01)
(52) U.S. Cl.
USPC .............. 359/484.02; 359/484.03; 359/484.1; 372/703; 252/585
(58) Field of Classification Search
USPC ............. 359/484.02, 484.03, 484.1; 372/703; 252/585
See application file for complete search history.

(56) References Cited

U.S. PATENT DOCUMENTS

| 3,640,887 | A |   | 2/1972  | Anderson |
|-----------|---|---|---------|----------|
| 4,668,052 | A | * | 5/1987  | Shirasaki ...................... 359/251 |
| 4,804,256 | A |   | 2/1989  | Wilson |
| 5,029,953 | A |   | 7/1991  | Dexter et al. |
| 5,052,786 | A | * | 10/1991 | Schulz ...................... 359/484.03 |
| 5,305,137 | A | * | 4/1994  | Ohkawara ...................... 359/281 |
| 5,512,193 | A | * | 4/1996  | Shirai et al. ................. 252/62.57 |
| 5,640,516 | A | * | 6/1997  | Iwatsuka et al. .............. 359/280 |
| 5,693,138 | A | * | 12/1997 | Onodera ........................... 117/8 |
| 6,542,299 | B2 | * | 4/2003 | Sato et al. ................ 359/484.03 |
| 6,775,052 | B2 | * | 8/2004 | Sugawara et al. ............ 359/324 |
| 7,071,687 | B2 | * | 7/2006 | Sekijima et al. ........... 324/244.1 |
| 7,110,179 | B2 | * | 9/2006 | Naylor et al. ............ 359/484.03 |
| 2002/0063941 | A1 | * | 5/2002 | Matsushita et al. ........... 359/280 |
| 2002/0149831 | A1 | * | 10/2002 | Matsushita et al. ........... 359/280 |

FOREIGN PATENT DOCUMENTS

| EP | 1 867 617 A1 | 12/2007 |
| EP | 1 992 599 A1 | 11/2008 |

OTHER PUBLICATIONS

European Search Report in European Patent Application No. 11000392.8; dated May 15, 2011.
Applied Optical Electronics Hand Book, edited by Applied Optical Electronic Hand Book Editorial Committee, Apr. 30, 1989, pp. 77-78.
Mar. 21, 2012 Official Communcation in European Application No. 11 000 392.8.
Summons to Attend Oral Proceedings issued in European Patent Application No. 11000392.8 dated Oct. 2, 2012.
Jun. 18, 2013 Japanese Office Action issued in Application No. 2010-012708 (with partial English-language Translation).

* cited by examiner

*Primary Examiner* — Ricky D Shafer
(74) *Attorney, Agent, or Firm* — Oliff & Berridge, PLC (57) ABSTRACT

An optical isolator including a Faraday rotator that has a high Faraday effect and a high transmission factor in a wavelength used is provided. An optical isolator comprises at least: a Faraday rotator; a polarizer arranged on a light incidence side of the Faraday rotator; and an analyzer arranged on a light exit side of the Faraday rotator, wherein the Faraday rotator consists of an oxide that contains an ytterbium oxide ($Yb_2O_3$) with a mass ratio of 30% or more.

4 Claims, 2 Drawing Sheets

FIG.2

OPTICAL ISOLATOR

BACKGROUND OF THE INVENTION

1. Field of the Invention

The present invention relates to an optical isolator, and more particularly to an optical isolator that can be preferably used for optical isolation in the wavelength range of 320 to 800 nm.

2. Description of the Related Art

In recent years, with advancement of laser processing machines, magneto-optic devices utilizing mutual interaction of light and magnetism have attracted attention.

As one of such devices, there is an optical isolator (see, e.g., Non-patent Literature 1 and others).

This device is configured to suppress a phenomenon that, when light oscillated from a laser light source is reflected by an optical system provided along the path and thereby returns to the light source, the light oscillated from the laser beam is disturbed to make an unstable oscillation state.

Therefore, for utilizing this operation, the optical isolator is utilized with arranging between the laser light source and an optical component.

This optical isolator mainly has three components, i.e., a Faraday rotator, a polarizer arranged on a light incidence side of the Faraday rotator, and an analyzer arranged on a light exit side of the Faraday rotator (the polarizer placed on an opposite side with respect to the Faraday rotator is also referred to as the analyzer).

Further, the optical isolator utilizes a so-called a Faraday effect, i.e., properties that a polarization plane is rotated in the Faraday rotator when light incidents the Faraday rotator in a state that a magnetic field is applied to the Faraday rotator in parallel to a traveling direction of the light.

That is, light having the same polarization plane as that of the polarizer in incident light passes through the polarizer and incidents the Faraday rotator. This light is rotated +45° with respect to the traveling direction of the light in the Faraday rotator and exits.

On the other hand, in regard to return light that incidents the Faraday rotator from an opposite direction of the incidence direction, light component that has the same polarization plane as that of the analyzer alone passes through the analyzer when first passing through the analyzer, and the light then incidents the Faraday rotator.

Furthermore, in the Faraday rotator, since the polarization plane of the return light is further rotated +45° from the first +45°, the polarization plane forming a right angle, i.e., +90° with respect to the polarizer is provided, and the return light cannot pass through the polarizer.

The optical isolator utilizes this phenomenon to prevent the return light from being produced.

Non-patent Literature 1: "Applied Optical Electronics Hand Book" edited by Applied Optical Electronic Hand Book Editorial Committee, pp. 77-78, Shokodo Co., Ltd.

Here, a material used for the Faraday rotator of the above-described optical isolator must have the high Faraday effect and a high transmission factor with respect to light having a wavelength utilized.

That is, for recently demanded miniaturization of the optical isolator, a thickness of the Faraday rotator need to be reduced, and therefore using a crystal having the high Faraday effect is the most realistic solution.

Moreover, attenuating the light in a traveling direction has a problem, and hence a higher transmission factor of the light is more advantageous.

SUMMARY OF THE INVENTION

In view of the above-described problem, it is an object of the present invention to provide an optical isolator including a Faraday rotator that has a high Faraday effect and a high transmission factor in a wavelength used.

To achieve this object, according to the present invention, there is provided an optical isolator comprising at least: a Faraday rotator; a polarizer arranged on a light incidence side of the Faraday rotator; and an analyzer arranged on a light exit side of the Faraday rotator, wherein the Faraday rotator consists of an oxide that contains an ytterbium oxide ($Yb_2O_3$) with a mass ratio of 30% or more.

As described above, when the Faraday rotator consists of the oxide containing the ytterbium oxide ($Yb_2O_3$) with a mass ratio of 30% or more is provided, a Faraday rotator's absorption of light having a wavelength range of, e.g., 320 to 800 nm is hardly observed, and a Faraday rotator's Verdet constant is high. Therefore, the optical isolator having such an oxide used for the Faraday rotator can be an optical isolator that is corresponding to the light having the wavelength and has a smaller size than conventional optical isolators.

Here, for the optical isolator, it is preferable for a wavelength of light to be polarized falls within the range of 320 to 800 nm.

As described above, since the oxide containing the ytterbium oxide ($Yb_2O_3$) with a mass ratio of 30% or more, which causes no absorption of light having a wavelength range of 320 to 800 nm and has a high Verdet constant, is used for the Faraday rotator, the optical isolator according to the present invention is preferable as the optical isolator for the light which is to be deflected and has the wavelength range of 320 to 800 nm.

Furthermore, it is preferable for the Faraday rotator to consist of a transparent oxide within the wavelength range of 320 to 800 nm.

As described above, when the Faraday rotator consists of the transparent oxide in the wavelength range of 320 to 800 nm, light absorption is not observed and scattering substantially does not occur in the wavelength range of 320 to 800 nm, thereby the higher-quality optical isolator can be obtained.

As described above, like the present invention, when the optical isolator use the Faraday rotator consisting of the oxide that has the high Verdet constant in the wavelength range of 320 to 800 nm and contains the ytterbium oxide ($Yb_2O_3$) with a mass ratio of 30% or more, it is possible to provide the miniaturized optical isolator which hardly causes absorption of light in the wavelength range and has a smaller thickness than that in the conventional optical isolators.

DETAILED DESCRIPTION OF THE PREFERRED EMBODIMENTS

The present invention will now be more specifically explained hereinafter.

As described above, a development of an optical isolator including a Faraday rotator that has a high Faraday effect and a high transmission factor in a wavelength used has been waited.

Here, a Faraday rotation angle θ can be represented as follows:

$$\theta = V \times H \times L$$

where V is a Verdet constant, which is a constant, determined based on a material of a Faraday rotator and a measured wavelength, H is an intensity of a magnetic field, and L is a length of the Faraday rotator.

An example of a method for measuring a Verdet constant will now be explained.

First, a material of the Faraday rotator having a diameter of 3 mm and a length of 10 mm is inserted into a magnet having a central magnetic field intensity of 1.3 T, a hole with an inside diameter of 5 mm, and a length of 30 mm.

Moreover, a laser beam having a beam diameter of 1 mm, beam power of 1 to 5 mW, and a predetermined wavelength incidents this material. Additionally, the Verdet constant can be measured by measuring a rotation angle of the laser beam exiting from the material with, e.g., a power meter. In later-described examples and comparative examples, light having wavelength of 800 nm, a 514-nm Ar laser beam and a 325-nm He—Cd laser beam were used as the laser beams.

Further, based on the Verdet constant measured by this method, a thickness L is determined to achieve θ=45° which enables to use as an optical isolator.

Consequently, the Faraday rotor having the Faraday rotation angle of 45° can be obtained.

In general, as a material having a high Verdet constant, there is a YIG (yttrium iron garnet) single crystal containing Fe, but such a material has considerable light absorption in the wavelength range of 320 to 800. Therefore, it cannot be used since an influence of this absorption seriously appears in the wavelength range of 320 nm to 800 nm.

Furthermore, as other materials, there are, e.g., terbium gallium garnet (a chemical formula: $Tb_3Ga_5O_{12}$) and others. However, such a material likewise has considerable light absorption in a wavelength range of 500 to 600 nm, an influence of this light absorption strongly appears in a wavelength range of 320 to 380 nm or 450 to 550 nm, and hence such a material cannot be used.

Moreover, glass containing lead is also used, but a Verdet constant is small in a wavelength range of 320 to 800 nm, and a light path becomes longer when this material is used as the Faraday rotator.

Thus, to solve the above-described problems, the present inventors have keenly repeatedly conducted examinations/experiments.

Here, since ytterbium has an orbit angular momentum L=3 like terbium, it is a paramagnetic element and also an element that does not cause absorption a wavelength range of 320 to 800 nm. Therefore, it is the most suitable element for use in an isolator in this wavelength band.

On the other hand, although terbium has a higher Verdet constant than that an ytterbium, it causes absorption in the wavelength range of 320 to 380 nm and 450 to 550 nm. Therefore, the present inventors have discovered that fabricating a compound that contains this ytterbium as much as possible leads to increasing the Verdet constant of this compound and also increasing the number of Faraday rotation angles.

Additionally, to fabricate a compound that does not causes absorption in the wavelength range of 320 to 800 nm, other constituent elements need be also transparent in this wavelength band, and the most suitable compound for such elements is an oxide of the element that causes no absorption in the wavelength range of 320 to 800 nm.

Here, a factor that decides a size of the optical isolator is determined based on a Verdet constant and an intensity of a magnetic field. Further, to reduce the size of the optical isolator, a material that decrease a length of the Faraday rotator which is a constituent component of the optical isolator as much as possible needs be developed.

Thus, in a wavelength used, a Verdet constant is preferably 0.05 min/Oe·cm or above, and it has been revealed that, if the Verdet constant is equal to or below this value, a length of a Faraday material becomes 50 mm or above according to a magnetic field used, thus a size of the isolator increases.

Moreover, as a result of further examinations/experiments, the present inventors have discovered that, if a material contains an ytterbium oxide with a mass ratio of 30% or more, a Verdet constant is not lower than 0.05 min/Oe·cm, a length of a Faraday material becomes 50 mm or below, a size of the isolator can be reduced, and light absorption hardly occurs in the wavelength range of 320 to 800 nm, thereby the present invention come to completion.

Figure 1:
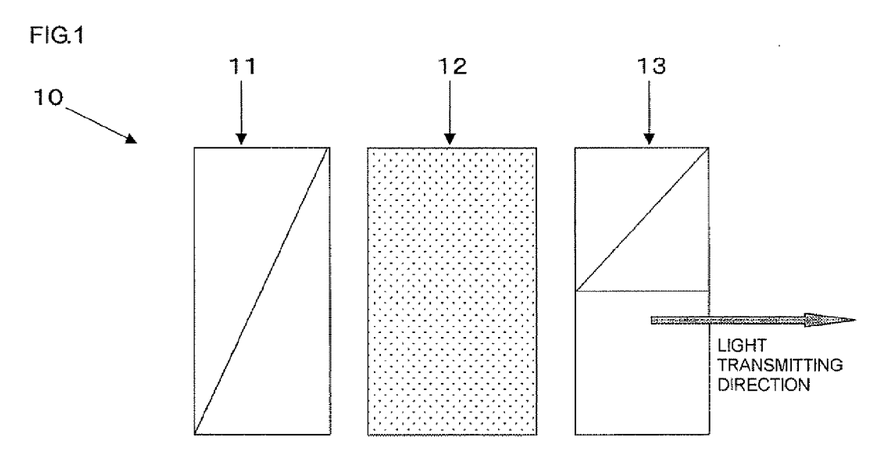
FIG. 1 is a view showing an example of an outline of the optical isolator according to the present invention.

The present invention will now be described hereinafter in detail with reference to the accompanying drawings, but the present invention is not restricted thereto. FIG. 1 is a view showing an example of an outline of the optical isolator according to the present invention.

As shown in FIG. 1, the optical isolator 10 according to the present invention includes at least a Faraday rotator 12 consisting of an oxide that contains an ytterbium oxide ($Yb_2O_3$) with a mass ratio of 30% or more, a polarizer 11 arranged on a light incidence side of the Faraday rotator, and an analyzer (the polarizer placed on the opposite side with respect to the Faraday rotator is also referred to as the analyzer) 13 arranged on a light exit side of the Faraday rotator.

As described above, when the Faraday rotator consists of the oxide that contains the ytterbium oxide ($Yb_2O_3$) with the mass ratio of 30% or more, light having a wavelength range of 320 nm to 800 nm is hardly absorbed, and a Verdet constant is high. Therefore, the optical isolator using such a Faraday rotator can be an optical isolator that is according to the light having the wavelength range of 320 to 800 nm and having a smaller size than those of conventional examples.

Further, as any other raw material/element than the ytterbium oxide ($Yb_2O_3$) constituting the Faraday rotator in the optical isolator according to the present invention, there is a solid solution mixed crystal obtained from the ytterbium itself or an oxide that has the same crystal structure as that of the ytterbium oxide, is the same rare-earth element and becomes stable with an oxidation valence which is trivalent, and does not absorb light having a wavelength range of 320 to 800 nm.

As candidates, there are yttria, scandium, lantern, gadolinium, lutetium, and others, and solid solution mixed crystals obtained from oxides of these materials and a terbium oxide are preferable.

Furthermore, a garnet crystal consisting of aluminum or gallium, e.g., a ytterbium aluminum garnet ($Yb_3Al_5O_{12}$) or a ytterbium gallium garnet ($Yb_3Ga_5O_{12}$) is also suitable.

It is to be noted that a material obtained by substituting such a garnet with yttria, scandium, lantern, gadolinium, lutetium, or any other element that can turn to a trivalent ion or a material obtained by doping an impurity element such as calcium, zirconium, or titanium may be used.

Moreover, as a method for fabricating these oxides constituting the Faraday rotator, any manufacturing method such as a floating zone melt method, a micro-pulling down method, a pulling method, a skull melt method, or a Bridgman method may be utilized to fabricate these oxides.

Additionally, a material does not need to be a single-crystal as long as it is transparent in a wavelength range of 320 to 800 nm and has no anisotropy such as a thermal damage, and transparent ceramics that is a polycrystal may be adopted.

Further, a glass material consisting of a silicon oxide, a boron oxide, an aluminum oxide, a titanium oxide, or any other element may be used as long as it contains the ytterbium oxide with a mass ratio of 30% or more.

Here, when manufacturing a solid solution polycrystal by a hot isostatic pressing method, a predetermined amount of a sintering additive, e.g., 0.001 to 0.01 parts by mass may be wet-blended. As the sintering additive, there is, e.g., a carbonate of an alkali earth metal such as a magnesium carbonate or a calcium carbonate, or an oxide of an effective element such as an alumina, a gallium oxide, a titanium oxide, a silicon oxide, or a germanium oxide.

Furthermore, a polarizing direction of the polarizer arranged on the light incidence side of the Faraday rotator and that of the analyzer arranged on the light exit side of the same form 45° with sandwiching the Faraday rotator therebetween.

As each of the polarizer and the analyzer, for example, a Glan-Thompson prism can be used. Moreover, for the wavelength range of 400 nm to 800 nm, a member manufactured by aligning shape anisotropy metal particles in a glass substrate may be used.

Additionally, the polarizer 11 and the analyzer 13 (antireflection films for air are formed at both ends of each member) are arranged at both ends of the Faraday rotator 12 (the antireflection films for air are formed at both ends thereof).

Here, the Faraday rotator may consist of an oxide that is transparent in the wavelength range of 320 to 800 nm.

The Faraday rotator consisting of an oxide that contains an ytterbium oxide ($Yb_2O_3$) with a mass ratio of 30% or more hardly causes light absorption in the wavelength range of 320 to 800 nm and has a high Verdet constant. Further, when the Faraday rotator consisting of a transparent oxide is adopted, scattering hardly occurs, and a high-quality optical isolator can be obtained.

Further, a wavelength of light to be polarized can fall within the range of 320 to 800 nm.

As described above, in the optical isolator according to the present invention in which the oxide containing the ytterbium oxide ($Yb_2O_3$) with a mass ratio of 30% or more is utilized as the Faraday rotator, the Verdet constant is high, and light absorption with respect to the light having the wavelength range of 320 to 800 nm is hardly observed. That is, the optical isolator that is superior in transmission of the light having the wavelength range of 320 to 800 nm and prevention of the return light is provided.

EXAMPLES

The present invention will now be more specifically explained hereinafter with reference to examples and comparative examples, but the present invention is not restricted thereto.

Examples 1 to 4, Comparative Examples 1-3

A crystal for a Faraday rotator was manufactured by the floating zone melt method.

Specifically, powder raw materials that are high-purity $Yb_2O_3$ and $Y_2O_3$ each having a purity of 99.9% were first prepared as raw materials, weighing was performs so that a ratio between $Yb_2O_3$ and $Y_2O_3$ can correspond to crystals each having such a predetermined molar ratio as shown in a later-described Table 1, and some of mixed powder raw materials were doped with predetermined amounts of a lutetium oxide, and a magnesium oxide as a third constituent element, beside an yttrium oxide (Examples 1 to 4, Comparative Examples 1 to 3).

Then, pure water was added to the above-described raw material composition to perform wet blending for three hrs, and the mixed powder was dehydrated and subjected to vacuum drying.

Thereafter, this powder was pulverized, then ethanol and ethylene glycol were added, and wet blending was performed to provide a slurry. This slurried mixture was formed into a cylindrical shape having a diameter of 3 mm and a length of 50 mm by using a forming machine.

This formed object was sintered in an argon atmosphere at 1600° C. for two hours to obtain a ceramics sinter having a diameter of 3 mm and a length of 50 mm.

Figure 2:
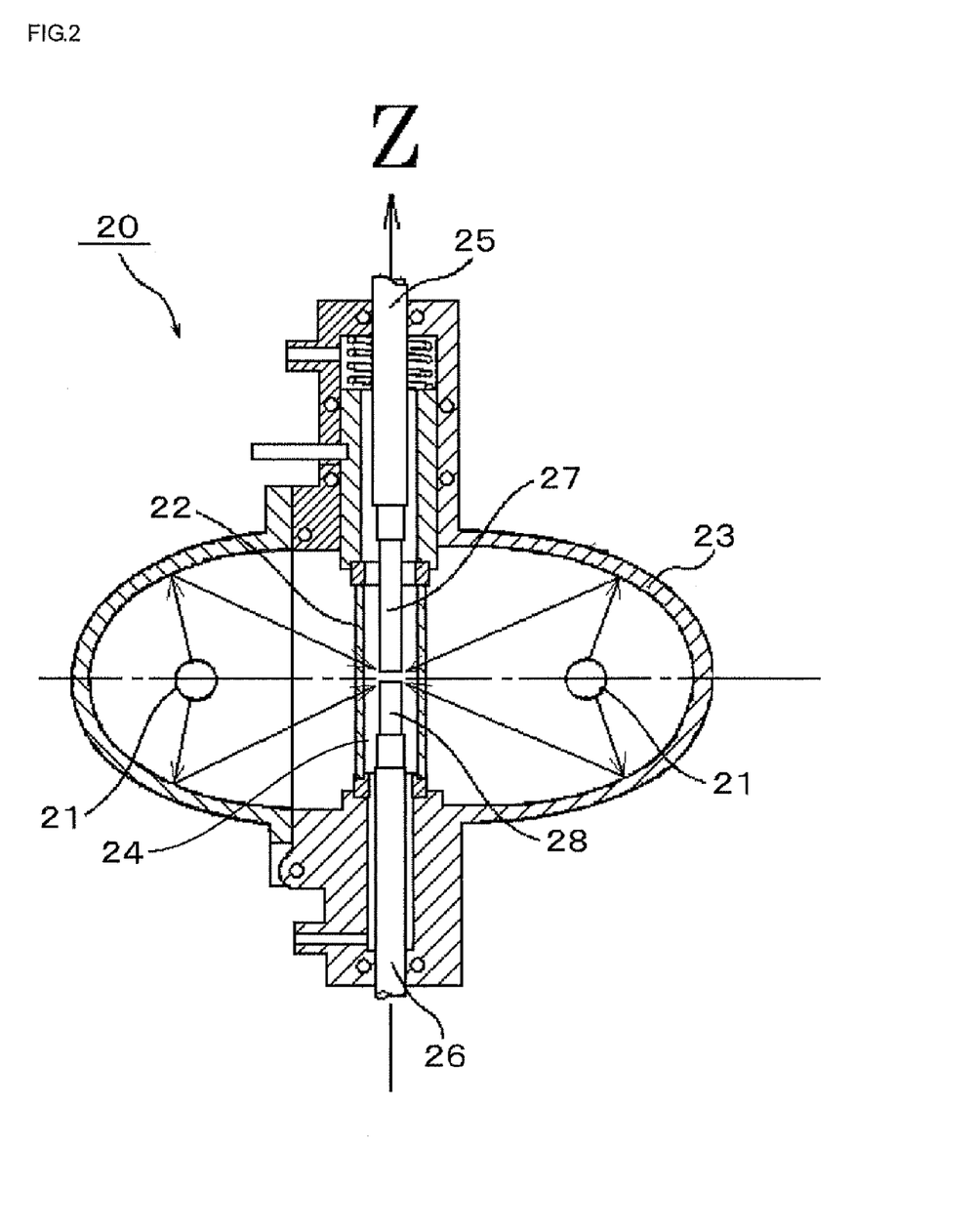
FIG. 2 is a view showing an outline of a xenon lamp FZ apparatus used in growth of a crystal, which is the basis for the Faraday rotator according to each of Examples 1 to 4 and Comparative Examples 1 to 3

Then, such a xenon lamp FZ apparatus as depicted in FIG. 2 was utilized to grow a single-crystal.

As shown in FIG. 2, a xenon lamp FZ apparatus 20 is an apparatus manufactured by Nichiden Machinery Ltd., has a configuration that a melting xenon lamp 21 (a light source) and an ellipsoidal mirror 23 are provided, and can condense light on a sample from the xenon lamp 21 to perform heating and melting.

This optical FZ apparatus 20 provides a floating zone furnace constituted of a hollow quartz tube 22 into which a sample is inserted and a melting chamber 24 that surrounds at least a part of the quartz tube 22 in such a manner that the quartz tube 22 can be placed at a central axis portion and that is formed by endlessly connecting four ellipsoidal mirrors 23 having the same width so as to be equally distanced from the surrounded quartz tube 22.

A xenon lamp 21 is disposed to a curved surface of each of the four ellipsoidal mirrors 23, and an inner surface side of each ellipsoidal mirror 23 is mirror-finished. Xenon lights emitted from the xenon lamps 21 are reflected on the mirror-finished ellipsoidal mirrors 23 to incidence to the quartz tube 22 at the central axis portion from four directions.

Although a halogen lamp can be used as a light source besides the xenon lamp, the xenon lamp has an advantage that an achieving temperature can be increased and a collecting power can be sharpened to steepen a temperature gradient.

Further, a rotatable upper shaft 25 and a lower shaft 26 arranged to be downwardly apart from a lower end of the upper shaft 25 are provided in the quartz tube 22. The upper shaft 25 and the lower shaft 26 can move up and down in the quartz tube 22. Furthermore, the inside of the quartz tube 22 is configured in such a manner that an atmosphere can be controlled to enable crystal growth.

Moreover, the ceramics sinter having the diameter of 3 mm and the length of 50 mm is disposed as a raw material rod to the upper shaft 25. Additionally, although disposing a material that turns to a seed crystal to the lower shaft 26 is desirable, the ceramics sinter having the same composition, the diameter of 3 mm, and the length of 50 mm may be disposed. Here, a sinter disposed to the upper shaft 25 is a feed rod 27, and a sinter or a material, which turns to a seed crystal, disposed to the lower shaft 26 is a seed rod 28.

Further, the quartz tube 22 was subjected to drying and deoxidization processing, and then an argon gas and several % of a hydrogen gas were supplied from a non-illustrated end toward the other end to provide a positive pressure, thereby preventing air from entering the quartz tube 22 from the outside.

Subsequently, after disposing the ceramics sinters having the same composition, the diameter of 3 mm, and the length of 50 mm to the upper shaft 25 and the lower shaft 26, the shafts were arranged in such a manner that the respective end portions can come close to each other, and outputs of the xenon lamps 21 were increased to a temperature at which both a lower end of the feed rod 27 and an upper end of the seed rod 28 start to dissolve in this state. Further, the respective rods were moved closer to each other without rotating.

In this state, the two rods are brought into contact with each other to form a melt portion. At this time, the seed rod 28 and the feed rod 27 were slowly moved down at a rate of 8 mm/hr while finely adjusting the outputs of the xenon lamps so that the formed melt portion can adequately maintain a melt shape based on surface tension. As a result, a crystal having a predetermined composition was formed at a lower part of the melt portion, i.e., an upper part of the seed rod 28, and a crystal substance having a diameter of 4 mm was grown in the above-described example when descending speeds of the seed rod 28 and the feed rod 27 were adjusted to be equal to each other.

Furthermore, when the crystal substance reached a length of 30 mm, the lowering operation for the rods was stopped, and the outputs of the xenon lamps were slowly lowered to decrease the temperature over eight hours, thereby obtaining a transparent crystal subject.

It is to be noted that, since the obtained crystal was grown under conditions where a temperature gradient is precipitous, a thermal damage at the time of growth remains, and a crack is produced when slicing the crystal. Therefore, after the crystal growth, the grown crystal was put into a carbon container, and annealing was performed at 1800° C. in an argon atmosphere by using a carbon furnace, thereby removing the thermal damage.

Both ends of the annealed solid solution single crystal having a diameter of 4 mm and a length of 30 mm was sliced by using an inner-diameter slicer, this single crystal was subjected to grinding, and both end surfaces of this single crystal were mirror-surfaced by using a polishing agent such as a colloidal silica.

Furthermore, a Verdet constant of the obtained cylindrical crystal having the diameter of 3 mm and the length of 25 mm was measured by using the above-described method/conditions. Table 1 shows a result of this measurement.

As shown in Table 1, the Faraday rotator according to each of Examples 1 to 4 and Comparative examples 1 to 3 has a transmission factor of approximately 90% with respect to light having a wavelength of 600 nm, and this value is excellent.

Moreover, in regard to the Faraday rotator according to each of Examples 1 to 4 that contains an ytterbium oxide with a mass ratio of 30% or more, a Verdet constant is 0.05 or above with respect to light having a wavelength of 800 nm and a Verdet constant is also high with respect to lights having wavelengths of 514 nm and 325 nm, and performance is sufficient to rotate transmission light 45° even though a thickness of the Faraday rotator is small, thereby the Faraday rotator substantially contributes to a reduction in size of an optical isolator.

On the other hand, in regard to the Faraday rotator according to each of Comparative Examples 1 to 3 that contains the ytterbium oxide with the mass ratio of less than 30%, the Verdet constant is less than 0.05 with respect to the light having the wavelength of 800 nm, and it was found out that reducing the size of the Faraday rotator is difficult. Additionally, the Verdet constants with respect to the lights having the wavelengths 514 nm and 325 nm are smaller than that of the Faraday rotator according to each of Examples 1 to 4, and it was understood that performance is inferior to that of the optical isolator according to each of Examples 1 to 4.

Examples 5 to 7, Comparative Examples 4 to 5

Subsequently, a single-crystal that is to function as the Faraday rotator was grown by using a pulling apparatus.

This pulling apparatus has an iridium crucible having a diameter of 50 mm and a ceramics insulating material having a diameter of 100 mm around the iridium crucible, and a high-frequency induction heating coil having a diameter of 150 mm is provided on an outer peripheral portion. Further, a ceramics insulating material is also disposed to an upper portion of the iridium crucible, and an after-heater consisting of iridium is arranged. Furthermore, this apparatus provides a seed holder that holds a seed which is brought into contact with a melt, a movement mechanism that moves the seed holder to an upper side, a moving speed control device for the movement mechanism, and a device that controls the induction heating coil which heats the crucible.

TABLE 1

| | $Yb_2O_3$ | $Y_2O_3$ | $Lu_2O_3$ | MgO Mass | $Yb_2O_3$ Mass | Transmission factor for light having | Verdet constant (min/Oe · cm) | | |
|---|---|---|---|---|---|---|---|---|---|
| | Molar ratio | Molar ratio | Molar ratio | ratio [%] | ratio [%] | wavelenght of 600 nm [%] | 800 nm light | 514 nm light | 325 nm light |
| Ex. 1 | 0.30 | 0.70 | 0.00 | 0.0 | 43 | 89 | 0.05 | 0.09 | 0.02 |
| Ex. 2 | 0.50 | 0.50 | 0.00 | 0.0 | 64 | 88 | 0.07 | 0.11 | 0.26 |
| Ex. 3 | 0.40 | 0.00 | 0.60 | 0.0 | 40 | 87 | 0.06 | 0.10 | 0.24 |
| Ex. 4 | 0.30 | 0.70 | 0.00 | 0.1 | 43 | 86 | 0.05 | 0.08 | 0.19 |
| Com. Ex. 1 | 0.20 | 0.80 | 0.00 | 0.0 | 30 | 90 | 0.04 | 0.07 | 0.14 |
| Com. Ex. 2 | 0.30 | 0.00 | 0.70 | 0.0 | 30 | 88 | 0.04 | 0.06 | 0.13 |
| Com. Ex. 3 | 0.20 | 0.80 | 0.00 | 0.1 | 30 | 85 | 0.03 | 0.06 | 0.13 |

Moreover, high-purity $Yb_2O_3$ and $Ga_2O_3$ each having purity of 99.9% as raw materials and powder raw materials $Y_2O_3$ and $Lu_2O_3$ as elements lying in the site of a third element Re were prepared, and weighing was performed so that a $(Yb_xRe_{(1-x)})_3Ga_5O_{12}$ crystal ($0<x\leq1$) having such a predetermined molar ratio as shown in later-described Table 2 can be provided (Examples 5 to 7, Comparative Examples 4 and 5).

Then, pure water was added to the above-described raw material composition, wet blending was carried out for three hours, and the mixed powder was dehydrated and subjected to vacuum drying.

Thereafter, this powder was pulverized, ethanol and ethylene glycol were added, and wet blending was carried out to provide slurry. This slurried mixture was formed into a cylindrical shape having a diameter of 40 mm and a length of 50 mm by using a forming machine. This formed object was sintered in an argon atmosphere at 1600° C. for two hours to obtain a ceramics sinter.

Further, a single-crystal growth apparatus prepared in advance was utilized to set into the crucible the sintered raw material subjected to the vacuum drying by the above-described method.

Furthermore, before increasing a temperature, evacuation was carried out, then an argon gas having purity of 99.99% was introduced into the furnace to provide an inert gas atmosphere in the furnace, and high-frequency power was gradually applied to the high-frequency induction heating coil to heat the crucible, thereby completely the raw material was melted. Subsequently, the melt was maintained in this state for several hours so as to uniform a composition of the melt.

Thereafter, the seed crystal having the diameter of 3 mm and the length of 30 mm was gradually pulled up at a predetermined rate, an end of the seed crystal was brought into contact with the melt and sufficiently adapted to the melt, and the seed crystal was slowly pulled up while adjusting a melt temperature, thus the crystal was grown.

After growing the seed crystal into the crystal having a diameter of 10 mm and a length of 20 mm, the crystal was maintained by the after-heater, and it was gradually cooled to a room temperature in this state.

It is to be noted that, since the obtained crystal was grown under conditions where a temperature gradient is precipitous, a thermal damage provided during the growth remains, and a crack is caused when slicing the crystal. Therefore, after the crystal growth, the crystal was put into a carbon container, and annealing was carried out in an argon atmosphere at 1800° C. by using a carbon furnace to remove the thermal damage.

Both ends of the annealed solid solution single crystal having a diameter of 10 mm and a length of 20 mm was sliced by using an inner-diameter slicer, this single crystal was subjected to grinding, and both end surfaces of this single crystal were mirror-surfaced by using a polishing agent such as a colloidal silica.

A Verdet constant of the obtained cylindrical crystal having dimensions of 3 mm and 25 mm was measured under the same conditions as those of Examples 1 to 4 and Comparative Examples 1 to 3. Table 2 shows a result of this measurement.

TABLE 2

| | $Yb_2O_3$ Molar ratio | $Y_2O_3$ Molar ratio | $Lu_2O_3$ Molar ratio | $Ga_2O_3$ Molar ratio | $Yb_2O_3$ Mass ratio [%] | Transmission factor for light having wavelength of 600 nm [%] | Verdet constant (min/Oe · cm) 800 nm light | 514 nm light | 325 nm light |
|---|---|---|---|---|---|---|---|---|---|
| Ex. 5 | 1.50 | 0.00 | 0.00 | 2.50 | 56 | 86 | 0.10 | 0.21 | 0.29 |
| Ex. 6 | 0.90 | 0.60 | 0.00 | 2.50 | 37 | 85 | 0.05 | 0.08 | 0.18 |
| Ex. 7 | 1.05 | 0.00 | 0.45 | 2.50 | 39 | 84 | 0.06 | 0.10 | 0.23 |
| Com. Ex. 4 | 0.75 | 0.75 | 0.00 | 2.50 | 32 | 85 | 0.04 | 0.08 | 0.15 |
| Com. Ex. 5 | 0.90 | 0.00 | 0.60 | 2.50 | 33 | 84 | 0.04 | 0.07 | 0.16 |

As shown in Table 2, the Faraday rotator according to each of Examples 5 to 7 and Comparative Examples 4 to 5 has a transmission factor of approximately 85% with respect to light having a wavelength of 600 nm, and this value is excellent.

Moreover, like the Faraday rotator consisting of the crystal manufactured by the floating zone melt method such as that according to each of Examples 1 to 4, the Faraday rotator according to each of Examples 5 to 7 that contains an ytterbium oxide with a mass ratio of 30% or more has a Verdet constant of 0.05 or above with respect to light having a wavelength of 800 nm. Further, the Verdet constants with respect to lights having wavelengths of 514 nm and 325 nm are also higher than those of Comparative Examples 4 and 5, and it was revealed that this Faraday rotator has performance that is sufficient to rotate transmission light 45° even though a thickness of the Faraday rotator is small.

On the other hand, like Comparative Examples 1 to 3, the Faraday rotator according to each of Comparative Examples 4 and 5 that contains the yttrium oxide with the mass ratio of less than 30% has the Verdet constant that is less than 0.05 with respect to the light having the wavelength of 800 nm, and it was found out that reducing a size of the Faraday rotator is difficult. Moreover, the Verdet constants with respect to the lights having the wavelengths of 514 nm and 325 nm are likewise smaller than that of the Faraday rotator according to each of Examples 5 to 7, and it was revealed that this Faraday rotator is not suitable for miniaturization of an optical isolator.

Examples 8 to 10, Comparative Examples 6 and 7

Like Examples 5 to 7, a single-crystal that is to function as a Faraday rotator was grown by using a pulling apparatus.

Here, high-purity $Yb_2O_3$ and $Al_2O_3$ each having purity of 99.9% as raw materials and powder raw materials $Y_2O_3$ and $Lu_2O_3$ as elements lying in the site of a third element Re were prepared, and weighing was performed so that a $(Yb_xRe_{(1-x)})_3Al_5O_{12}$ crystal ($0<x\leq1$) having such a predetermined molar ratio as shown in later-described Table 3 can be provided (Examples 8 to 10, Comparative Examples 6 and 7).

Other conditions, a crystal fabrication method, and an evaluation method are the same as the conditions for Examples 5 and 7 and Comparative Examples 4 and 5. Table 3 shows a result of this growth.

TABLE 3

|  | $Yb_2O_3$ Molar ratio | $Y_2O_3$ Molar ratio | $Lu_2O_3$ Molar ratio | $Al_2O_3$ Molar ratio | $Yb_2O_3$ Mass ratio [%] | Transmission factor for light having wavelength of 600 nm [%] | Verdet constant (min/Oe · cm) | | |
|---|---|---|---|---|---|---|---|---|---|
|  |  |  |  |  |  |  | 800 nm light | 514 nm light | 325 nm light |
| Ex. 8 | 1.50 | 0.00 | 0.00 | 2.50 | 70 | 87 | 0.12 | 0.24 | 0.32 |
| Ex. 9 | 0.75 | 0.75 | 0.00 | 2.50 | 41 | 86 | 0.06 | 0.11 | 0.24 |
| Ex. 10 | 0.90 | 0.00 | 0.60 | 2.50 | 42 | 85 | 0.06 | 0.10 | 0.23 |
| Com. Ex. 6 | 0.45 | 1.05 | 0.00 | 2.50 | 26 | 84 | 0.03 | 0.07 | 0.14 |
| Com. Ex. 7 | 0.60 | 0.00 | 0.90 | 2.50 | 28 | 83 | 0.03 | 0.06 | 0.15 |

As shown in Table 3, the Faraday rotator according to each of Examples 8 to 10 has a transmission factor of approximately 86% with respect to light having a wavelength of 600 nm, and this value is excellent as compared with a transmission factor of approximately 83% of the Faraday rotator according to each of Comparative Examples 6 and 7.

Additionally, like the Faraday rotator according to each of Examples 1 to 7, the Faraday rotator according to each of Examples 8 to 10 that contains an ytterbium oxide with a mass ratio of 30% or more has a Verdet constant of 0.05 or above with respect to light having a wavelength of 800 nm. Further, the Verdet constants with respect to lights having wavelengths of 514 nm and 325 nm are also high, and it was revealed that this Faraday rotator has sufficient performance.

On the other hand, like Comparative Examples 1 to 3 and Comparative Examples 4 and 5, the Faraday rotator according to each of Comparative Examples 6 and 7 that contains the yttrium oxide with the mass ratio of less than 30% has the Verdet constant that is less than 0.05 with respect to the light having the wavelength of 800 nm, its Verdet constant with respect to the lights having the wavelengths of 514 nm and 325 nm is likewise smaller than that of the Faraday rotator according to each of Examples 8 to 10, and it was revealed that this Faraday rotator is not suitable for miniaturization of an optical isolator.

Examples 11 to 14, Comparative Examples 8 to 10

Transparent ceramics as a solid solution polycrystal that is to function as a Faraday rotator was manufactured by a hot isostatic pressing method.

Specifically, high-purity powder materials $Yb_2O_3$ and $Y_2O_3$ each having purity of 99.9% were first prepared as raw materials, and weighing was carried out in such a manner that a ratio between $Yb_2O_3$ and $Y_2O_3$ can have predetermined molar ratios (Examples 11 to 14, Comparative Examples 8 to 10).

Furthermore, each material was dissolved to provide an aqueous nitric acid solution having a concentration of 1 mol/l, an aqueous ammonium sulfate solution having a concentration of 1 mol/l was added to this solution, and extra-pure water was further added to adjust the concentration.

An aqueous ammonium hydrogen carbonate solution having a concentration of 0.5 mol/l was dropped at a constant dripping rate until pH8 with stirring the obtained aqueous solution, and it was left for two days at a room temperature with stirring.

Then, filtration and cleaning with the extra-pure water were performed, and drying was performed at 150° for two days.

The obtained mixed powder was put into an alumina crucible, then preliminary baking was carried out in an electric furnace under conditions of an inert atmosphere, 1200° C., and three hours. The inert atmosphere was used in order to prevent a valence of an yttrium oxide from changing.

100 g of the obtained raw material powder, 50 g of methanol as a solvent, 1 g of polyvinyl alcohol as a binder, 1 g of polyethylene glycol as a plasticizer, and 0.5 g of a stearic acid as a lubricant agent were added, and wet blending was performed by using a nylon ball mill to obtain slurry. Then, predetermined amounts of an alumina, a calcium carbonate and a titanium oxide as sintering additives were mixed to this slurry, respectively.

The obtained slurry was processed by a treatment using a spray dryer to fabricate a dried spherical object. This dried spherical object was put into a die having a dimension of 5 mm to perform primary molding, and then it was molded under a pressure of 200 MPa by a cold isostatic pressing (CIP) method.

Further, a temperature of this molded object was increased to 400 to 600° C., and degreasing was carried out. At this time, the degreasing was performed in the atmosphere until the temperature reaches 400° C., and it was performed in the inert atmosphere at a higher temperature than 400° C.

Then, a calcination was performed in a vacuum furnace at 1700° C. for 8 to 10 hours. As temperature rising conditions at the time of the calcination, 300° C./hrs was set until the temperature reaches 1200° C., and 50° C./hr was set at a higher temperature than 1200° C. A degree of vacuum was set to $0.5 \times 10^{-1}$ Pa.

Furthermore, to enhance transparency, a hot isostatic pressing (HIP) method was performed at 1800° C. under a pressure of 100 MPa for 10 hours.

Both ends of the annealed solid solution polycrystal having a diameter of 3 mm and a length of 30 mm was sliced by using an inner-diameter slicer, and both end surfaces of this polycrystal were mirror-surfaced by using a polishing agent such as a colloidal silica.

A Verdet constant of the obtained cylindrical crystal having the diameter of 3 mm and the length of 25 mm was measured under the same conditions as those for Examples 1 to 4 and Comparative Examples 1 to 3. Table 4 shows a result of this measurement.

TABLE 4

| | $Yb_2O_3$ Molar ratio | $Y_2O_3$ Molar ratio | $Al_2O_3$ Mass ratio [%] | CaO Mass ratio [%] | $TiO_2$ Mass ratio [%] | $Yb_2O_3$ Mass ratio [%] | Transmission factor for light having wavelength of 600 nm [%] | Verdet constant (min/Oe · cm) 800 nm light | 514 nm light | 325 nm light |
|---|---|---|---|---|---|---|---|---|---|---|
| Ex. 11 | 0.30 | 0.70 | 0.1 | 0.0 | 0.0 | 43 | 83 | 0.05 | 0.09 | 0.20 |
| Ex. 12 | 0.30 | 0.70 | 0.0 | 0.1 | 0.0 | 43 | 82 | 0.06 | 0.10 | 0.20 |
| Ex. 13 | 0.30 | 0.70 | 0.0 | 0.0 | 0.1 | 43 | 83 | 0.06 | 0.10 | 0.21 |
| Ex. 14 | 0.30 | 0.70 | 0.1 | 0.1 | 0.1 | 43 | 82 | 0.05 | 0.08 | 0.19 |
| Com. Ex. 8 | 0.20 | 0.80 | 0.2 | 0.0 | 0.0 | 30 | 83 | 0.04 | 0.07 | 0.14 |
| Com. Ex. 9 | 0.20 | 0.80 | 0.0 | 0.2 | 0.0 | 30 | 82 | 0.04 | 0.06 | 0.13 |
| Com. Ex. 10 | 0.20 | 0.80 | 0.0 | 0.0 | 0.2 | 30 | 83 | 0.03 | 0.06 | 0.13 |

As shown in Table 4, the Faraday rotator according to each of Examples 11 to 14 and Comparative Examples 8 to 10 has a transmission factor of approximately 83% with respect to light having a wavelength of 600 nm.

Moreover, like the Faraday rotator according to each of Examples 1 to 10, the Faraday rotator according to each of Examples 11 to 14 that contains an ytterbium oxide with a mass ratio with 30% or more has a Verdet constant of 0.05 or above with respect to light having a wavelength of 800 nm. Additionally, the Verdet constants with respect to lights having wavelengths of 514 nm and 325 nm are also high, and it was revealed that this Faraday rotator has sufficient performance.

On the other hand, like Comparative Examples 1 to 7, the Faraday rotator according to each of Comparative Examples 8 to 10 that contains the yttrium oxide with the mass ratio of less than 30% has the Verdet constant is less than 0.05 with respect to the light having the wavelength of 800 nm, its Verdet constant with respect to the lights having the wavelengths of 514 nm and 325 nm is likewise smaller than that of the Faraday rotator according to each of Examples 11 to 14, and it was revealed that this Faraday rotator is not suitable for miniaturization of an optical isolator.

Examples 15 and 16, Comparative Examples 11 and 12

Glass that is to function as a Faraday rotator was manufactured by a melting method.

Specifically, high-purity powder materials $Yb_2O_3$, $SiO_2$, $B_2O_3$, $Ga_2O_3$, $GeO_2$, and $P_2O_5$ each having purity of 99.9% were first prepared as raw materials, and weighing was carried out in such a manner that predetermined molar ratios can be obtained (Examples 15 and 16, Comparative Examples 11 and 12).

After mixing these materials, a crucible made of platinum was utilized to melt the materials in an electric furnace at 1400 to 1500° C. for approximately 2 to 5 hours. Stirring was performed by using a stirring blade made of platinum during melting to uniform a composition of a melt.

Thereafter, the melt was casted into a die to mold into a predetermined shape, and annealing was carried out in the electric furnace at 600 to 700° C. for 5 to 10 hours, thereby the glass was obtained.

Both ends of the annealed glass having dimensions of 3 mm and 30 mm was sliced by using an inner-diameter slicer, and both end surfaces of this glass were mirror-surfaced by using a polishing agent such as a colloidal silica.

A Verdet constant of the obtained cylindrical crystal having the dimensions of 3 mm and 25 mm was measured under the same conditions as those for Examples 1 to 4 and Comparative Examples 1 to 3. Table 5 shows a result of this measurement.

TABLE 5

| | $B_2O_3$ Mass ratio [%] | $SiO_2$ Mass ratio [%] | $Ga_2O_3$ Mass ratio [%] | $GeO_2$ Mass ratio [%] | $P_2O_5$ Mass ratio [%] | $Yb_2O_3$ Mass ratio [%] | Transmission factor for light having wavelength of 600 nm [%] | Verdet constant (min/Oe · cm) 800 nm light | 514 nm light | 325 nm light |
|---|---|---|---|---|---|---|---|---|---|---|
| Ex. 15 | 19 | 20 | 24 | 4 | 0 | 33 | 82 | 0.05 | 0.09 | 0.20 |
| Ex. 16 | 17 | 20 | 24 | 0 | 6 | 33 | 81 | 0.06 | 0.10 | 0.20 |
| Com. Ex. 11 | 20 | 24 | 24 | 4 | 0 | 28 | 82 | 0.04 | 0.07 | 0.14 |
| Com. Ex. 12 | 18 | 24 | 24 | 0 | 6 | 28 | 81 | 0.03 | 0.06 | 0.13 |

As shown Table 5, the Faraday rotator according to each of Examples 15 and 16 and Comparative Examples 11 and 12 has a transmission factor of approximately 82% with respect to light having a wavelength of 600 nm.

Further, like the Faraday rotator according to each of Examples 1 to 14, the Faraday rotator according to each of Examples 15 and 16 that contains an ytterbium oxide with a mass ratio of 30% or more has a Verdet constant of 0.05 or above with respect to light having a wavelength of 800 nm. Furthermore, its Verdet constant with respect to lights having wavelengths of 514 nm and 325 nm is also high, and it was revealed that this Faraday rotator has sufficient performance.

On the other hand, like Comparative Examples 1 to 10, the Faraday rotator according to each of Comparative Examples 11 and 12 that contains the yttrium oxide with the mass ratio of less than 30% has the Verdet constant that is less than 0.05 with respect to the light having the wavelength of 800 nm, its Verdet constant with respect to the lights having the wavelengths of 514 nm and 325 nm is likewise smaller than that of the Faraday rotator according to each of Examples 15 and 16, and it was revealed that this Faraday rotator is not suitable for miniaturization of an optical isolator.

It is to be noted that the present invention is not restricted to the foregoing embodiment. The foregoing embodiment is just an exemplification, and any examples that have substantially the same configuration and exercise the same operation and effect as the technical concept described in claims according to the present invention are included in the technical scope of the present invention.

What is claimed is:

1. An optical isolator comprising at least:
    a Faraday rotator;
    a polarizer arranged on a light incidence side of the Faraday rotator; and
    an analyzer arranged on a light exit side of the Faraday rotator,
    wherein
        the Faraday rotator consists of an oxide that contains an ytterbium oxide ($Yb_2O_3$) with a mass ratio of 56% or more, with the remainder of the oxide being yttrium oxide ($Y_2O_3$).

2. The optical isolator according to claim 1, wherein a wavelength of light to be polarized falls within the range of 320 to 800 nm.

3. The optical isolator according to claim 2, wherein the oxide is a transparent oxide within the wavelength range of 320 to 800 nm.

4. The optical isolator according to claim 1, wherein the oxide is a transparent oxide within the wavelength range of 320 to 800 nm.

* * * * *